(12) United States Patent  (10) Patent No.: US 8,664,957 B2
Obermann  (45) Date of Patent: Mar. 4, 2014

(54) HIGH-CURRENT CABLE CONNECTION FOR GRADIENT CABLES OF A MAGNETIC RESONANCE TOMOGRAPHY SYSTEM

(75) Inventor: Peter Obermann, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 348 days.

(21) Appl. No.: 13/194,693

(22) Filed: Jul. 29, 2011

(65) Prior Publication Data

US 2012/0025831 A1 Feb. 2, 2012

(30) Foreign Application Priority Data

Jul. 30, 2010 (DE) .......................... 10 2010 032 830

(51) Int. Cl.
*G01V 3/00* (2006.01)

(52) U.S. Cl.
USPC .......................................... 324/318

(58) Field of Classification Search
USPC .................................. 324/300–322
See application file for complete search history.

(56) References Cited

U.S. PATENT DOCUMENTS

| 6,954,068 B1* | 10/2005 | Takamori et al. | ............. 324/318 |
| 8,057,251 B2* | 11/2011 | Kreher et al. | ................. 439/470 |
| 8,471,561 B2* | 6/2013 | Schuster et al. | ............. 324/318 |

* cited by examiner

*Primary Examiner* — Dixomara Vargas
(74) *Attorney, Agent, or Firm* — Lempia Summerfield Katz LLC

(57) ABSTRACT

The present embodiments relate to a method and gradient cable connection for a magnetic resonance tomography system. The gradient cable connection connects cable shoes of two gradient cables to one another. A first fastening device is provided with two nuts. Using the first fastening device, the cable shoes are pressed against one another by the two nuts, the two nuts being disposed on a bolt on opposing sides of the cable shoes. A second fastening device is also provided. Using the second fastening device, the bolt is pressed against a support plate by the bolt and one of the two nuts.

20 Claims, 4 Drawing Sheets

HIGH-CURRENT CABLE CONNECTION FOR GRADIENT CABLES OF A MAGNETIC RESONANCE TOMOGRAPHY SYSTEM

This application claims the benefit of DE 10 2010 032 830.8, filed on Jul. 30, 2010.

BACKGROUND

The present embodiments relate to a cable connection for a magnetic resonance tomography (MRT) system and an MRT system and a method.

Magnetic resonance tomography devices for examining objects or patients using magnetic resonance tomography (MRT, MRI) are known, for example, from DE 10314215B4.

SUMMARY

The present embodiments may obviate one or more the drawbacks or limitations in the related art. For example, a gradient cable connection for a magnetic resonance tomography (MRT) system may be optimized.

Gradient cable connections may feature a specific structure in design terms with advantages.

DETAILED DESCRIPTION OF THE DRAWINGS

Figure 4:
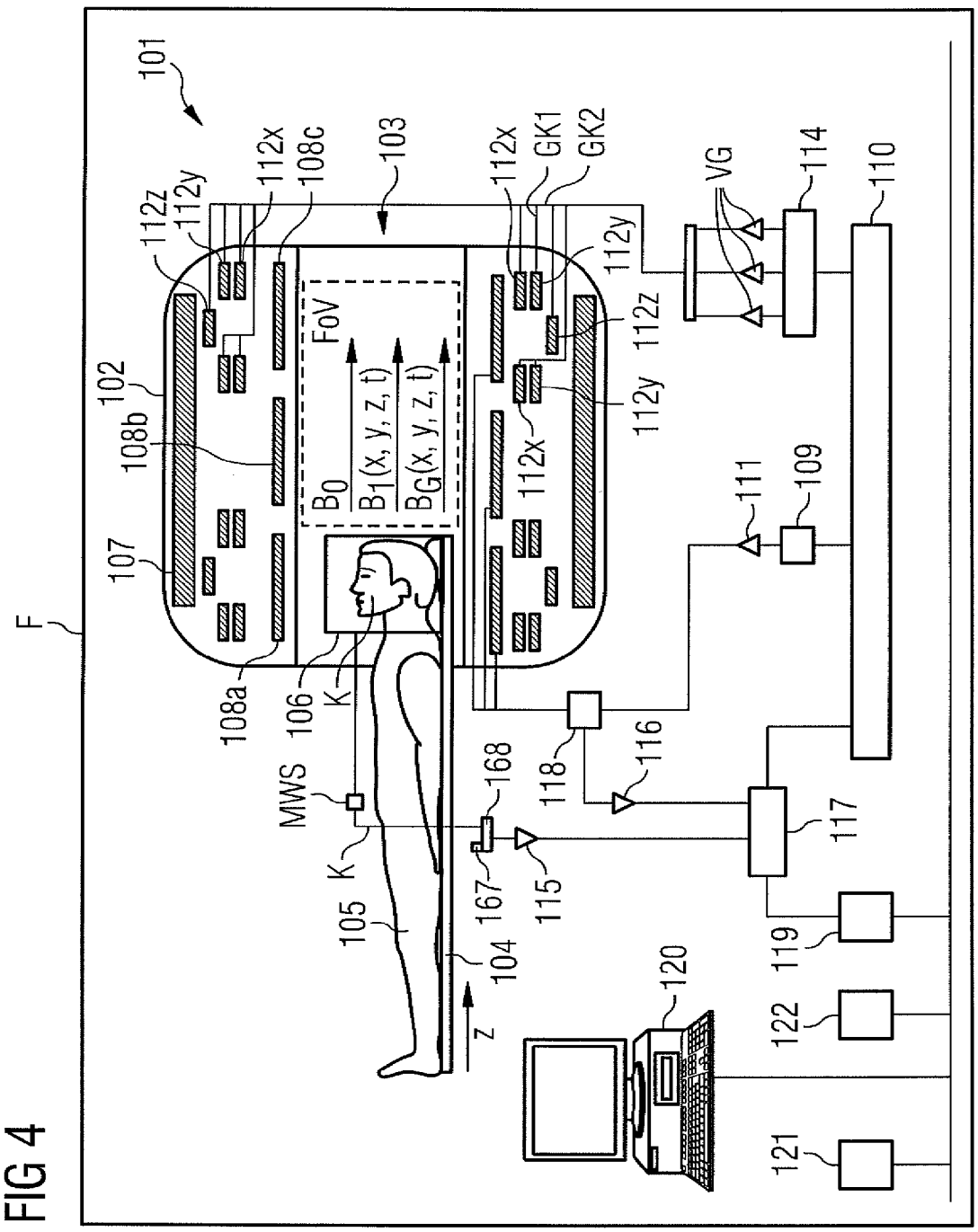
FIG. 4 shows a schematic and simplified diagram of a magnetic resonance tomography (MRT) system.

FIG. 4 shows an imaging magnetic resonance device MRT 101 (e.g., in a shielded room or Faraday cage F) with a whole body coil 102 with, for example, a tubular space 103, into which a patient couch 104 (e.g., a patient bed) holding a body of an examination object 105 (e.g., a patient with or without a local coil arrangement 106), for example, may be moved in the direction of the arrow z in order to generate recordings of the patient 105 using an imaging procedure. Positioned on and/or below (e.g., in the case of spinal column coils on or in the patient table) the patient is the local coil arrangement 106. The local coil arrangement 106 may be used to generate recordings in a local region (e.g., a field of view). Signals from the local coil arrangement 106 may be evaluated by an evaluation facility (e.g., an evaluation system, elements 115, 117, 119, 120, and 121) of the imaging magnetic resonance device MRT 101 (e.g., a magnetic resonance device) that may be connected, for example, by way of a local coil connection line KX (e.g., a coaxial cable). Alternatively, the evaluation facility may be connected by radio (e.g., elements 167 and 168) to the local coil arrangement 106 (e.g., being converted to images, stored or displayed).

In order to use a magnetic resonance device MRT 101 to examine a body 105 (e.g., an examination object or a patient) using magnetic resonance imaging, different magnetic fields, the temporal and spatial characteristics of which are matched as closely as possible, are radiated onto the body 105. A powerful magnet (e.g., a cryomagnet 107) in a measuring cabin with, for example, a tunnel-type opening 103 generates a static powerful main magnetic field $B_0$ of, for example, 0.2 Tesla to 3 Tesla or even more. A body 105 to be examined is supported on a patient couch 104 and moved into a roughly homogeneous region of the main magnetic field B0 in the field of view FoV. The nuclear spin of atomic nuclei of the body 105 is excited by way of magnetic high-frequency excitation pulses B1 (x, y, z, t) that are radiated in by way of a high-frequency antenna (and/or optionally a local coil arrangement) illustrated in FIG. 4 in a simplified manner as a body coil 108 (e.g., a multipart body coil 108a, 108b, 108c). High-frequency excitation pulses are generated, for example, by a pulse generating unit 109. The pulse generating unit is controlled by a pulse sequence control unit 110. After amplification by a high-frequency amplifier 111, the generated high-frequency excitation pulses are routed to the high-frequency antenna 108. The high-frequency system shown in FIG. 4 is only indicated schematically. More than one pulse generating unit 109, more than one high-frequency amplifier 111 and a plurality of high-frequency antennas 108 a, b, c may be used in the magnetic resonance device MRT 101.

The magnetic resonance device MRT 101 also includes gradient coils 112x, 112y, 112z that are used during a measurement to radiate in magnetic gradient fields for selective layer excitation and local encoding of the measurement signal. The gradient coils 112x, 112y, 112z are controlled by a gradient coil control unit 114 that, like the pulse generating unit 109, is connected to the pulse sequence control unit 110.

Signals emitted by the excited nuclear spins (e.g., of the atomic nuclei in the examination object) are received by the body coil 108 and/or at least one local coil arrangement 106, amplified by assigned high-frequency preamplifiers 116 and further processed and digitized by a receive unit 117. The recorded measurement data is digitized and stored as complex numerical values in a k-space matrix. A multidimensional Fourier transformation may be used to reconstruct an associated MR image from the value-populated k-space matrix.

With a coil that may be operated in both transmit and receive mode (e.g., the body coil 108 or a local coil), correct signal forwarding is regulated by an upstream transmit/receive switch 118.

An image processing unit 119 uses the measurement data to generate an image that is displayed to a user by way of an operating console 120 and/or is stored in a storage unit 121. A central computer unit 122 controls the individual system components.

In magnetic resonance (MR) tomography, images with a high signal-to-noise ratio (SNR) may be recorded using local coil arrangements (e.g., coils, local coils). These are antenna systems that are positioned in direct proximity on (anterior), below (posterior) or in the body. During an MR measurement, the excited nuclei induce a voltage in the individual antennas of the local coil. The induced voltage is amplified using a low-noise preamplifier (e.g., LNA, preamp) and is forwarded to the electronic receive system. To improve the signal to noise ratio even with high-resolution images, high-field systems are used (e.g., 1.5 T and more). If more individual antennas may be connected to an MR receive system than there are receivers present, a switching matrix (e.g., RCCS), for example, is incorporated between receive antennas and receivers. This routes the currently active receive channels (e.g., receive channels present in the field of view of the magnet at the time) to the receivers present. This allows more coil elements to be connected than there are receivers present, since for whole body coverage, only the coils present in the FoV or the homogeneity volume of the magnet are to be read out.

The local coil arrangement 106 may be, for example, an antenna system that may include, for example, of one or a plurality of antenna elements or coil elements (e.g., an array coil). The individual antenna elements are configured as, for example, loop antennas (e.g., loops), butterfly coils or saddle coils. The local coil arrangement 106 includes, for example, coil elements, a preamplifier, further electronics (e.g., baluns), a housing, supports and a cable KB with a plug, for example, used to connect the local coil arrangement 106 to the magnetic resonance tomography (MRT) system (e.g., elements 168 and 117). A receiver 168 on the system side filters and digitizes a signal received from the local coil 106 (e.g., by radio or cable) and transmits the data to a digital signal processing facility (e.g., a digital signal processing system). The digital signal processing facility derives an image or spectrum from the data obtained by measurement and makes the derived image or spectrum available to the user (e.g., for the purposes of subsequent diagnosis and/or for storage).

Figure 2:
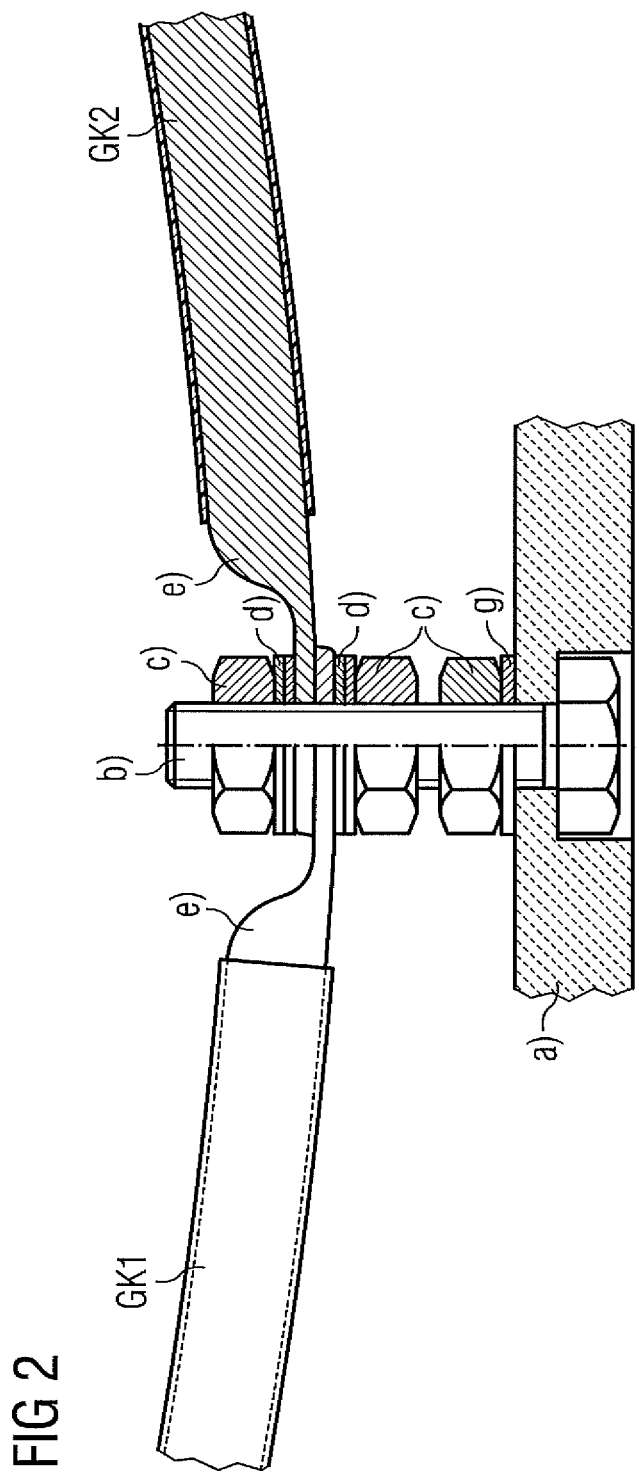
FIG. 2 shows one embodiment of a gradient cable connection.
Figure 3:
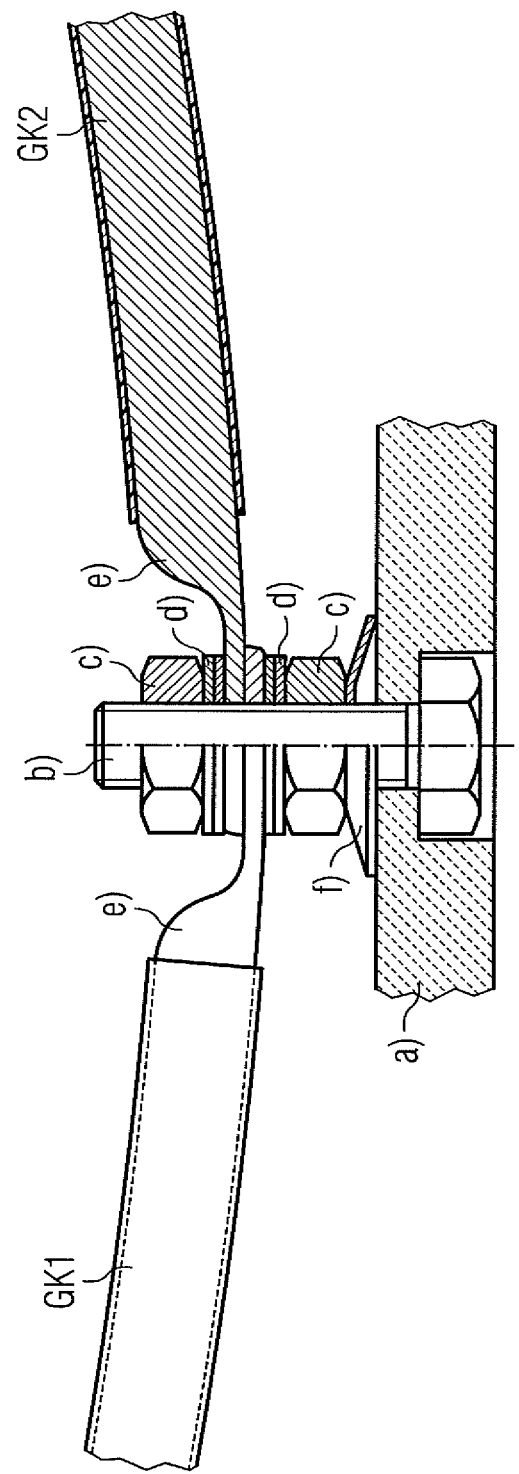
FIG. 3 shows another embodiment of a gradient cable connection.

Possible details of exemplary embodiments of MRT gradient cable connections (e.g., connections for gradient cables; cables leading, for example, to a gradient coil and/or a power supply of the gradient coil) are set out in more detail with reference to FIGS. 2-3.

Figure 1:
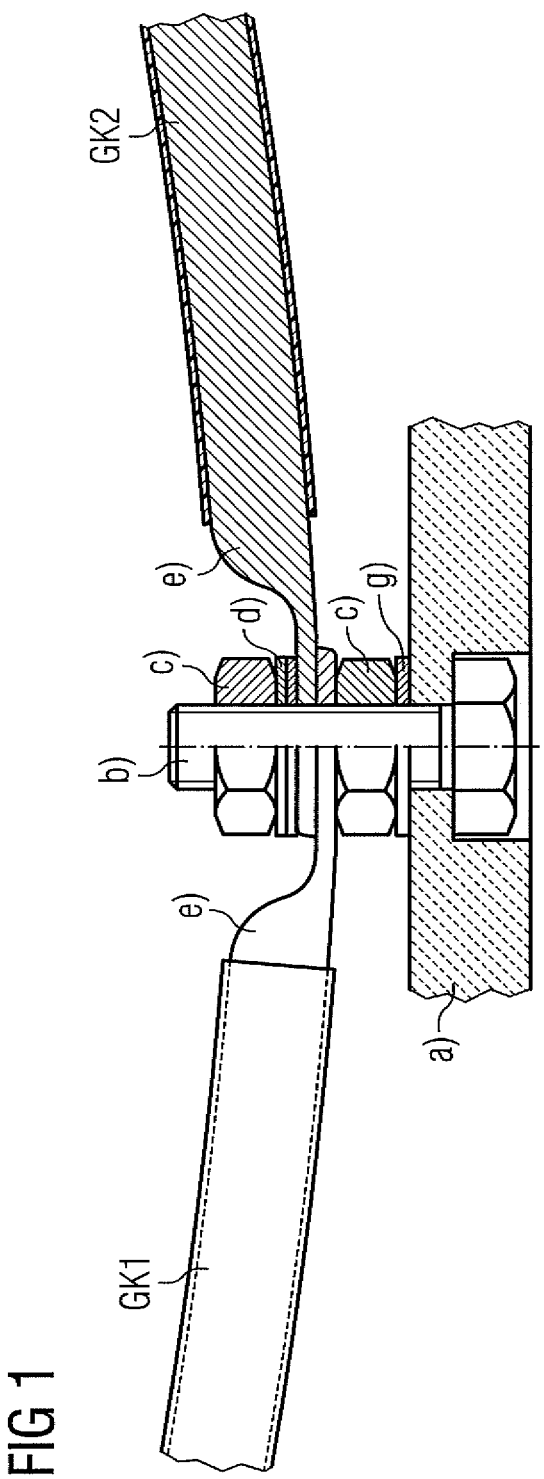
FIG. 1 shows a cross section through one embodiment of a gradient cable connection.

In the embodiment according to FIG. 1, the functions "fixing" (e.g., of bolts to a support plate) and "contact union" (e.g., connecting a cable shoe in a defined manner) are not separate and may influence one another, as described below. However, failure may not be the case; rather, undefined states may result, which may (individually) result in initially apparently inexplicable failures or errors as a function of the individual circumstances of the respective installation.

A bolt b (e.g., a screw with a screw head and a thread) is inserted in an insulating support plate a (e.g., made of fiber-reinforced plastic). The bolt b is fixed by way of a washer g and a first nut c in the support plate a (e.g., in a slotted groove in the support plate a). Two cable shoes e to be connected are positioned directly on this structure (e.g., on the free end of the bolt) and fixed by a second nut c (e.g., an upper nut in FIG. 1; with a "Nordlock" screw securing system below the second nut c) by way of a defined tightening torque. As a result, the cable shoes e are initially subjected to a defined pressing force that may diminish over time due to the "flowing" of the plastic of the support plate.

Details of the phenomena that may be involved are as follows: The first nut c (e.g., a lower nut in FIG. 1) for fixing the bolt b to the support plate a is tightened to a lesser degree (e.g., hand tightened with an unspecified torque) than the second nut c. When the second nut c is tightened in a defined manner (e.g., by way of the cable shoes e in between) due to the thread play of the union of the first nut c, this causes a contact force of the fixing on the support plate a to increase as a function of a tightening of the first nut c, an elasticity of the support plate a, and a position of the first nut c to be undefined in relation to thread flanks (e.g., of the bolt b) in contact therewith. After the second nut has been tightened in a defined manner, a contact point of the table shoes is subjected to a defined contact force. Plastics, which may be subjected to high contact forces/pressures, may tend to "flow" in a material-specific manner when loaded for long periods essentially due to elastoplastic properties of the plastics. In other words, the plastics may yield in a pressure region. In the longer term, this may result in a reduction in the originally set contact pressure, which, depending on the thread play situation, may also cause the contact force of the contact union to be reduced. Reduced contact force in the contact region reduces conductance of the contact region and may result in overheating, fires and also to the occurrence of spikes (e.g., sparks) that reduce image quality.

In one embodiment according to FIG. 2 or FIG. 3, for example, the functions "fixing" (e.g., of the bolt to the support plate) and "contact union" (e.g., cable shoes connected in a defined manner) may be combined morphologically or in the arrangement, but the associated force flows (e.g., traction or continuous force transmission of a contact force) are separate.

In one embodiment according to FIG. 2 or FIG. 3, for example, the bolt b is inserted in the insulating support plate a (e.g., an insulating support plate a made of fiber-reinforced plastic).

According to FIG. 3, the bolt b is fixed by way of a spring element f with defined spring characteristics (e.g., a plate spring washer or a wave spring washer) and the first nut c (e.g., bottom nut in FIG. 3) in the support plate a (e.g., in a slotted groove in the support plate a). The first nut c is tightened in a defined manner with low torque; in the process, the spring element f present below the first nut c (e.g., lower nut in FIG. 3) is pretensioned in a defined manner and exerts a defined contact force on the support plate a. The first nut c (e.g., with a "Nordlock" screw securing system d above the first nut), the two cable shoes e to be connected and the second nut c (e.g., upper nut in FIG. 3) in FIG. 3 (e.g., with the "Nordlock" screw securing system d below the second nut c) bring about an independent contact union (and contact) between the cable shoes e, for example, with higher torque than the torque, with which the first nut c on the bolt b is screwed to the spring element f. With the arrangement according to FIG. 3, the tightening of the top nut c with a higher torque provides that a greater force is exerted on the bottom nut c (e.g., by way of the cable shoes e in between) than by the spring element f below. This change in load due to the then closed force flow in the union of the cable shoes e causes the bottom nut c to change thread flanks of the bottom nut c resting on a thread of the bolt b. In other words, the bottom nut c settles in a defined manner about flank play. Tightening the top nut c produces a defined contact force or defined contact pressure on the cable shoes e. A possible change (flow) in the support plate a may only bring about a reduction in the spring force of the spring element f that due to the defined play-free contact of the thread flanks of the nut c and the thread flanks of the bolt b, has no impact on the contact force or contact pressure acting on the cable shoes e.

In one embodiment according to FIG. 2, for example, the bolt b is similarly inserted in the insulating support plate a (e.g., made of fiber-reinforced plastic). The bolt b is fixed by way of a washer g and the first nut c (e.g., bottom nut in FIG. 2) in the support plate a (e.g., in a slotted groove in the support plate a). The first nut c is tightened in a defined manner with low torque (e.g., compared with the torque for joining two upper nuts); in the process, the washer g present below the first nut c is pretensioned in a defined manner and exerts a defined contact force on the support plate a. Located at a defined distance (e.g., clearly visible in FIG. 2 as a separating gap between the first nut c and a second nut c) above the first nut c is a union of the cable shoes e, as described below. The second nut c (e.g., center nut in FIG. 2; with the "Nordlock" screw securing system d above the second nut c), the two cable shoes e to be connected and a third nut c (e.g., top nut in FIG. 2) in FIG. 2 (e.g., with the "Nordlock" screw securing system d below the third nut c) bring about an independent contact union between the second nut c and the third nut c, which is tightened with a defined torque that may be higher than the tightening torque of the first nut c.

The connection between the cable shoes e is secured by a contact pressure between the third nut c in FIG. 2 and the second nut c, while the bolt b is fixed in the support plate a by the first nut c independently thereof.

This separate arrangement provides that a closed force flow results in the union of the cable shoes e, by way of the bolt b, the top nut C, the two cable shoes e, the center nut c and, if present, washers or "Nordlock" screw securing systems d in between. This arrangement provides that the thread flanks of the top nut c and the center nut c rest in a defined manner against the corresponding thread flanks of the bolt b, thereby excluding any influence of the thread play on the union.

A closed force flow (e.g., a force or contact force transmitted between two parts optionally by way of elements in between) results in a segment of the contact union (e.g., between the cable shoes e) that is independent of a force flow in a segment of the fixing union between the bolt b on the support plate a and the bottom nut c. This defined separation of the force flows provides that the contact union is independent of the fixing union, and "flowing" of the plastic material cannot impact on the contact union. This effectively prevents long term reduction of the contact force acting on the contacts and the damaging consequences.

Because of potentially limited space conditions, assembly and service in the exemplary embodiment according to FIG. 3 may be simpler than in the exemplary embodiment according to FIG. 2.

Possible advantages of the present embodiments may be: greater safety, reliability, prevention or reduction of gradient cable fires possibly requiring corresponding emergency measures and downtimes, prevention or reduction of corresponding image quality problems ("spikes"), and the reduction of service visits and replacement part requirements.

The present embodiments permit greater product safety and quality for MRT systems by improving the reliability of the gradient cable connections, for example, by preventing gradient cable fires and system failures and/or by preventing image quality problems due to gradient-induced "spikes."

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A gradient cable connection for a magnetic resonance tomography system, the gradient cable connection connecting cable shoes of two gradient cables to one another, the gradient cable connection comprising:
   a first fastening device comprising at least two nuts, wherein the cable shoes are pressed against one another by the at least two nuts, the at least two nuts being disposed on a bolt on opposing sides of the cable shoes; and
   a second fastening device pressing the bolt against a support plate using the bolt and a first nut of the at least two nuts.

2. The gradient cable connection as claimed in claim 1, wherein a second nut of the at least two nuts and the support plate do not have a form fit with respect to one another, and
   wherein the second nut is further from the support plate than the first nut.

3. The gradient cable connection as claimed in claim 1, wherein the second fastening device comprises a spring element between the support plate and the first nut.

4. The gradient cable connection as claimed in claim 3, wherein the spring element comprises a plate spring or a wave washer.

5. The gradient cable connection as claimed in claim 1, wherein the second fastening device comprises a third nut pressing the cable shoes against one another, the third nut being disposed between the second nut and the support plate.

6. The gradient cable connection as claimed in claim 1, wherein one or more of force flows, pressures, and form that fix the bolt to the support plate and fix the cable shoes to one another are separated by a spring element or a third nut.

7. The gradient cable connection as claimed in claim 1, wherein the first nut and the support plate do not include form fits with respect to one another, the first nut being closer to the support plate than the second nut, and
   wherein the second fastening device comprises a third nut, the third nut pressing the bolt against the support plate.

8. The gradient cable connection as claimed in claim 1, wherein the two gradient cables are cables leading to gradient coils, a gradient coil power supply, or are connectable to the gradient coils, the gradient coil power supply.

9. The gradient cable connection as claimed in claim 1, wherein the bolt is a screw.

10. The gradient cable connection as claimed in claim 1, wherein the bolt is pressed against the support plate by a head of the bolt and the first nut.

11. The gradient cable connection as claimed in claim 1, wherein the support plate is an insulator.

12. The gradient cable connection as claimed in claim 1, wherein the second nut is tightened, pretensioned, or tightened and pretensioned with greater torque than the first nut, and
   wherein the first nut is closer to the support plate than the second nut.

13. The gradient cable connection as claimed in claim 1, wherein the torque, with which the second nut is tightened, is higher than the torque, with which the first nut is tightened, and
   wherein the first nut is closer to the support plate than the second nut.

14. The gradient cable connection as claimed in claim 3, wherein the spring element between the first nut and the support plate exerts a contact force on the support plate.

15. The gradient cable connection as claimed in claim 1, wherein a force flow in a segment of a contact union of the cable shoes is independent of or separate from a force flow in a segment fixing the bolt to the support plate.

16. The gradient cable connection as claimed in claim 1, wherein the gradient cable connection is an electrically conducting connection between the cable shoes at ends of the two gradient cables.

17. The gradient cable connection as claimed in claim 1, wherein the bolt is pressed against the support plate by the bolt and the first nut only using the second fastening device.

18. The gradient cable connection as claimed in claim 1, wherein the insulator is a plastic.

19. A magnetic resonance tomography (MRT) system comprising:
   at least one gradient cable connection connecting cable shoes of two gradient cables to one another, the at least one gradient cable connection comprising:
      a first fastening device comprising at least two nuts, wherein the cable shoes are pressed against one another by the at least two nuts, the at least two nuts being disposed on a bolt on opposing sides of the cable shoes; and a second fastening device pressing the bolt against a support plate using the bolt and a first nut of the at least two nuts.

20. A method for connecting cable shoes of two gradient cables for a magnetic resonance tomography system to one another in an electrically conducting manner, the method comprising:

pressing the cable shoes against one another by a first fastening device, the first fastening device comprising two nuts disposed on a bolt on opposing sides of the cable shoes; and pressing the bolt against a support plate by a second fastening device, the second fastening device comprising the bolt and at least one of the two nuts.

* * * * *